United States Patent [19]

Bayraktaroglu

[11] Patent Number: 5,097,312

[45] Date of Patent: Mar. 17, 1992

[54] HETEROJUNCTION BIPOLAR TRANSISTOR AND INTEGRATION OF SAME WITH FIELD EFFECT DEVICE

[75] Inventor: Burhan Bayraktaroglu, Plano, Tex.

[73] Assignee: Texas Instruments Incorporated, Dallas, Tex.

[21] Appl. No.: 701,570

[22] Filed: May 14, 1991

Related U.S. Application Data

[63] Continuation of Ser. No. 560,501, Jul. 24, 1990, abandoned, which is a continuation of Ser. No. 312,100, Feb. 16, 1989, abandoned.

[51] Int. Cl.$^5$ .................... H01L 27/02; H01L 29/72; H01L 29/161
[52] U.S. Cl. ........................ 357/43; 357/34; 357/16
[58] Field of Search ............... 357/16, 30, 42, 56, 357/61, 43, 34, 35

[56] References Cited

U.S. PATENT DOCUMENTS

| | | | |
|---|---|---|---|
| 4,446,476 | 5/1984 | Isaac et al. | 357/67 |
| 4,529,996 | 7/1985 | Pande | 357/16 |
| 4,821,090 | 4/1989 | Yokoyama | 357/16 |
| 4,827,320 | 5/1989 | Morkoc et al. | 357/16 |
| 4,829,346 | 5/1989 | Kasahara et al. | 357/16 |
| 4,872,046 | 10/1989 | Morkoc et al. | 357/16 |
| 4,879,255 | 11/1989 | Deguchi et al. | 431/59 |

FOREIGN PATENT DOCUMENTS

| | | |
|---|---|---|
| 0144242 | 6/1985 | European Pat. Off. . |
| 0276981 | 1/1988 | European Pat. Off. . |
| 2162370 | 7/1985 | United Kingdom . |

OTHER PUBLICATIONS

J. Tully et al., A Fully Planar Heterojunction Bipolar Transistor, 7 IEEE Elec. Dev. Lett. 615 (1986), pp. 615–617.
H. Kawai et al., A Collector-Up AlGaAs/GaAs Heterojunction Bipolar Transistor Fabricated Using Three-Stage MOCVD, 9 IEEE Elec. Dev. Lett. 419 (1988), pp. 419–421.
J. Tully, Heterojunction Bipolar Transistors with Ion-Implanted Bases, 7 IEEE Elec. Dev. Lett. 203 (1986), pp. 203–205.
Eric Watson, "Gallium Arsenide ICS Come Out of the Research Shadows", Jun. 25, 1985, pp. 27–29, 31, 33, 34, 37, *New Electronics*, vol. 18, No. 13, London, Great Britain.
A. K. Oki et al., "High Performance GaAs/AlGaAs Heterojunction Bipolar Transistor 4-Bit and 2-Bit A/D Converters and 8-Bit D/A Converter", Oct. 13–16, 1987, pp. 137–140, *IEEE: GaAs IC Symposium-Technical Digest,* Portland, Ore.

*Primary Examiner*—Mark Prenty
*Attorney, Agent, or Firm*—Richard A. Stoltz; Rene E. Grossman; Richard L. Donaldson

[57] ABSTRACT

An integrated circuit including both bipolar and field effect devices is disclosed, comprising a first continuous layer 102/104 of semi-insulating semiconductor material having a continuous first surface, a doped channel region 108 in the first layer 102/104 at the first surface of the first layer 102/104, a doped collector region 114 in the first layer 102/104 at the first surface spaced from the channel region 108, a doped base layer 122 on the collector region 114, the base layer 122 of conductivity type opposite that of the collector region 114, a doped emitter region 124 on the base layer 122, the emitter region 124 of the same conductivity type as the collector 114 to provide a bipolar device, the emitter region 124 made of semiconductor material with a wider bandgap than the base layer 122 semiconductor material, source and drain contacts 138 on the channel region 108, a gate 146 on the channel region 108 between the source and drain contacts 138 to provide a field effect device, and electrical coupling between at least one of the emitter 124, base 122 and collector 114 of the bipolar device and at least one of the gate 146, source and drain 138 of the field effect device. Other devices, systems and methods are also disclosed.

18 Claims, 6 Drawing Sheets

HETEROJUNCTION BIPOLAR TRANSISTOR AND INTEGRATION OF SAME WITH FIELD EFFECT DEVICE

This application is a continuation of application Ser. No. 07/560,501 filed Jul. 24, 1990 and now abandoned, which is a continuation of application Ser. No. 07/312,100 filed Feb. 16, 1989 and now abandoned.

CROSS REFERENCE TO RELATED APPLICATIONS

U.S. patent application Ser. Nos. 063,554, filed June 18, 1987 (L. Tran) now abandoned, 107,234, filed Oct. 9, 1987 (Plumton et al) now abandoned, and 312,101, filed Feb. 16, 1989 (Morris et al) now abandoned, disclose related subject matter. All of these cross-referenced items are assigned to the assignee of this application.

BACKGROUND OF THE INVENTION

1. Field of the Invention.

The present invention relates to semiconductor electronic integrated circuits, and, more particularly, to integrated circuits made of group III-V compound semiconductors including both field effect and bipolar devices.

2. Description of the Related Art.

Microwave components and subsystems may be generally divided into two classes: (1) hybrid and (2) monolithic integrated circuit (MMIC). Hybrid technology permits combinations of varying device types, circuits on varying substrate types, and passive components that are not entirely compatible with the MMIC technology. The best use of hybrid technology arises when high performance is required from a given circuit. In this case discrete devices (of possibly various types) are chosen and screened to insure maximum performance, passive circuits are produced on low loss substrates, and, after devices are connected to the circuits some tuning is applied to obtain the maximum performance for the resulting hybrid arrangement.

Conversely, MMIC technology is based on the use of only one type of device performing all of the circuits functions. The commonly used device type is the Schottky barrier gate GaAs field effect transistor (MESFET). The MESFET is flexible enough to be used in low noise amplifier, power amplifier, switch, mixer, doubler, and many other circuits. It performs most of these functions satisfactorily but none of them optimally. Other types of devices such as (high electron mobility transistors (HEMTs), heterojunction bipolar transistors (HBTs), and mixer diodes that can perform low noise, high power, or mixer functions better individually than MESFETs; but using one of these devices as the only device type in MMIC circuits improves one function while degrading others. The performance degradation resulting from the nonoptimal use of active devices is partly offset by the monolithic integration of passive circuits and active devices. In addition, batch processing offered by MMIC technology improves circuit complexity and lowers fabrication cost.

Silicon digital circuits make use of vertical npn switching transistors as well as lateral pnp transistors for input logic, current sources and level shifting. The addition of junction field effect transistors (JFETs) with silicon bipolar transistors results in analog circuits which operate at high speeds while offering very high input impedances. The versatility of combining bipolar circuits and JFETs in a silicon integrated circuit is well known.

Historically GaAs/AlGaAs heterojunction bipolar transistors (HBT) have been fabricated using mesa technology in which the collector, base and emitter epi layers are sequentially grown during a single epitaxial deposition run. The emitter and base epi layer are selectively removed using two etch steps for making contact to the base and collector areas, respectively. These etches result in steps in the GaAs ranging in height between 0.4 and 1.0 micron for a typical mesa HBTs. See for example, K. Nagata et al, Self-Aligned AlGaAs/GaAs HBT with Low Emitter Resistance Utilizing InGaAs Cap Layer, 35 IEEE Tr.Elec.Dev. 2 (1988). Although high quality HBTs can be fabricated in this manner, the resulting mesa structure results in very severe topography making it difficult to incorporate a multilevel metal system as required for high levels of integration.

Planar heterojunction bipolar transistors have been fabricated as elements of integrated circuits in the emitter down configuration; see for example, L. Tran et al, GaAs/AlGaAs Heterojunction Emitter-Down Bipolar Transistors Fabricated on GaAs-on-Si Substrate, 8 IEEE Elec.Dev.Lett. 50 (1987). This avoids the mesa topography but has the drawbacks of limited npn base doping and limited multiple device integration possibilities. The deep base implant through the collector limits the base doping resulting in a high base sheet resistance and a "flat" doping profile. The integration possibilities have been explored in copending application Ser. No. 063,554, filed June 18, 1987 (L. Tran) where an n-channel JFET was proposed with the npn. To integrate any more devices would require major changes in the epi and many additional processing steps. In addition, this technology requires all of the npn transistors to be connected in the common emitter configuration which severely limits its applications.

Although a single epitaxial deposition run as used in the mesa HBTs and emitter-down HBTs does simplify the fabrication process, it limits the types of structures which can be integrated together on a single chip.

U.S. Pat. No. 4,529,996 discloses an InP-BP heterojunction bipolar transistor in which a boron phosphide emitter is grown through an opening in a silicon dioxide mask on a indium phosphide substrate containing base and collector regions.

However, overgrowth methods have the drawbacks of not integrating multiple devices into the process and requiring spatially selective deposition of epitaxial layers. In the case of selective epi deposition, the epi material that falls on the silicon dioxide mask is wasted, and the selective epi process can lead to severe interface problems at the edges of openings in the silicon dioxide mask, resulting in regions of high stress and defect levels. The work of J. W. Tully, 7 IEEE Elec.Dev.Lett. 203 (1986) in emitter overgrowth onto an implanted base used Zn as a dopant because of the high mass and low implant range, however Zn diffuses rapidly in an uncontrolled manner at the temperatures needed for the second epi growth. Additionally, Tully integrates only a single type of device, the npn HBT.

Thus the known MMIC methods have a problem of integrating GaAs MESFETs with HBTs.

SUMMARY OF THE INVENTION

The present invention provides monolithically integrated MESFETs and HBTs and a fabrication method including selective implantations followed by epitaxial growth of base and emitter layers for the HBT. This process allows integration in semi-insulating GaAs which provides isolation of devices without trenches or lattice damage implants.

In preferred embodiments, first HBT collector and MESFET channel and contact regions are implanted into a semi-insulating GaAs wafer and then epitaxial in situ doped base and emitter layers are grown over the entire wafer. The emitter and base layers are patterned and etched in a self-aligned process followed by the MESFET recessed gate process. This provides a simple process yielding quasi-planar vertical HBTs together with MESFETs.

This solves the problems of the known methods of integrating different devices by providing a simple process with quasi-planar vertical devices.

BRIEF DESCRIPTION OF THE DRAWINGS

The drawings are schematic and the vertical has been exaggerated for clarity.

DESCRIPTION OF THE PREFERRED EMBODIMENTS

Figure 1:
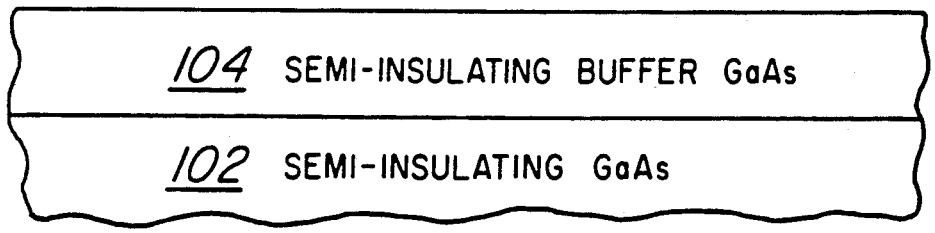
FIGS. 1-10 are cross sectional elevation views of a first preferred embodiment and the steps of a first preferred embodiment fabrication method.
Figure 2:
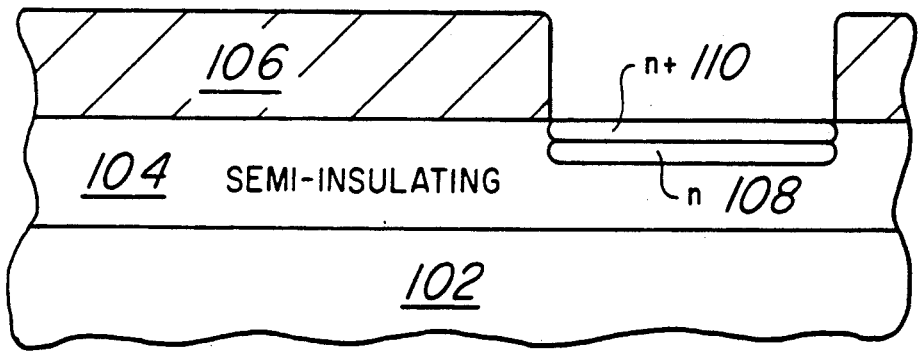
Figure 3:
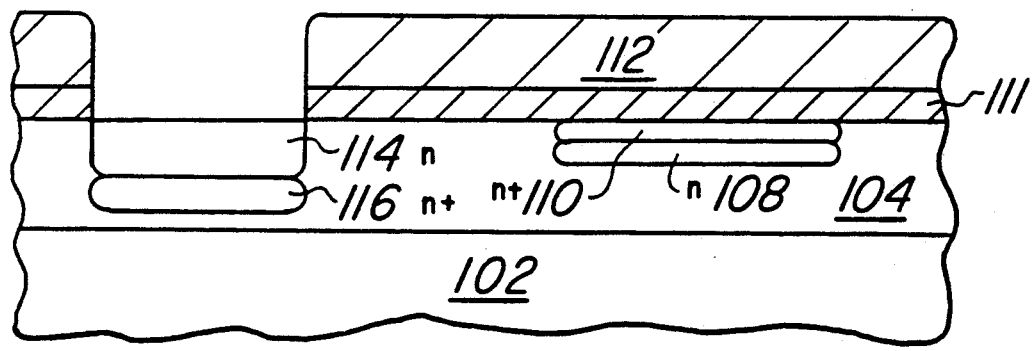
Figure 4:
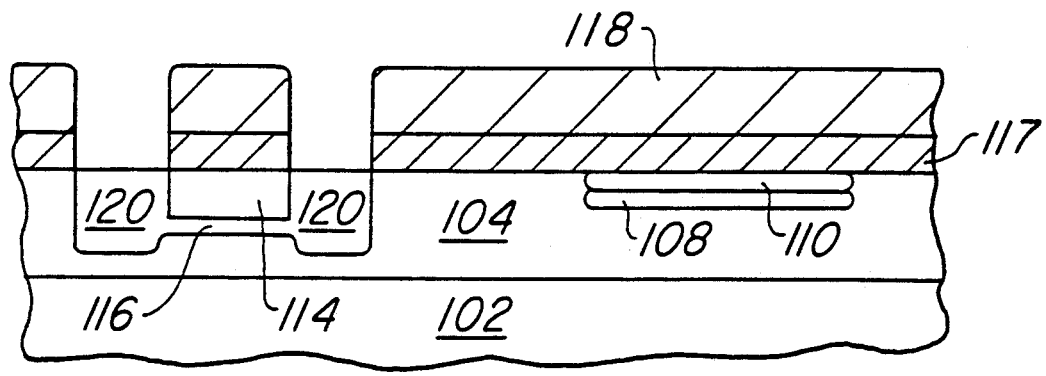
Figure 5:
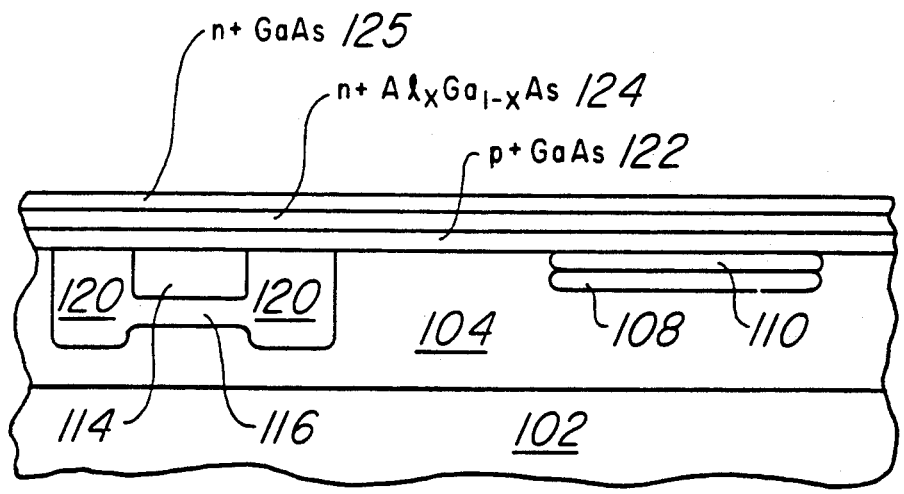
Figure 6:
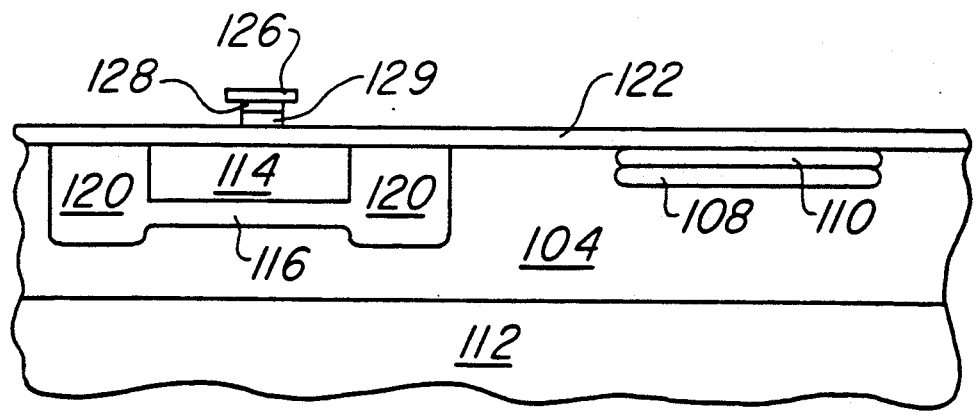
Figure 7:
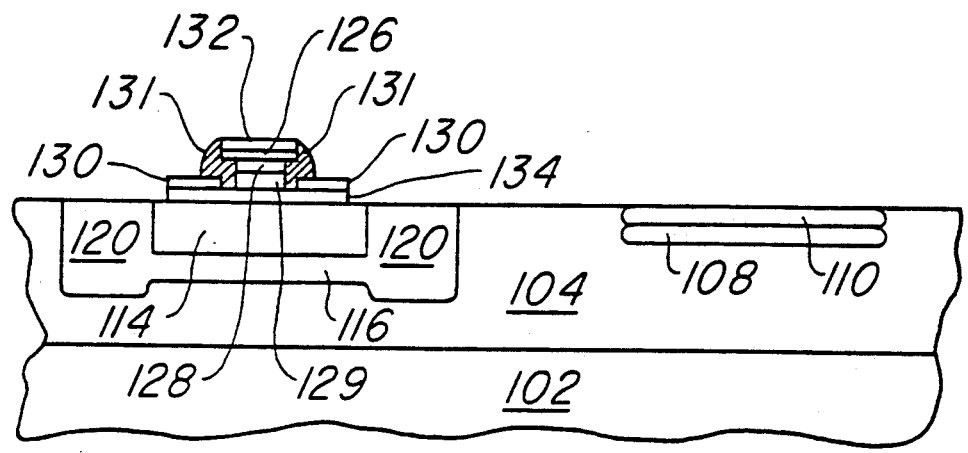
Figure 8:
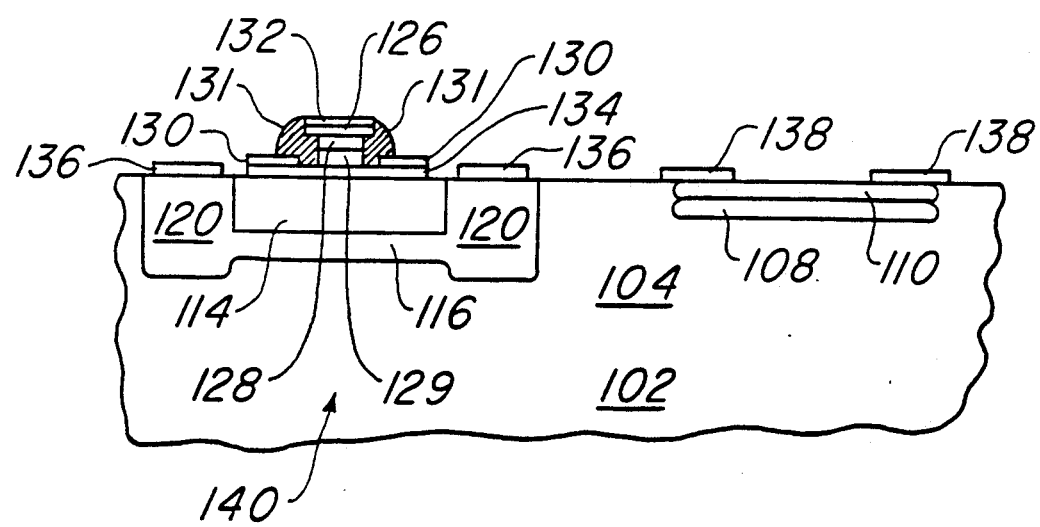
Figure 9:
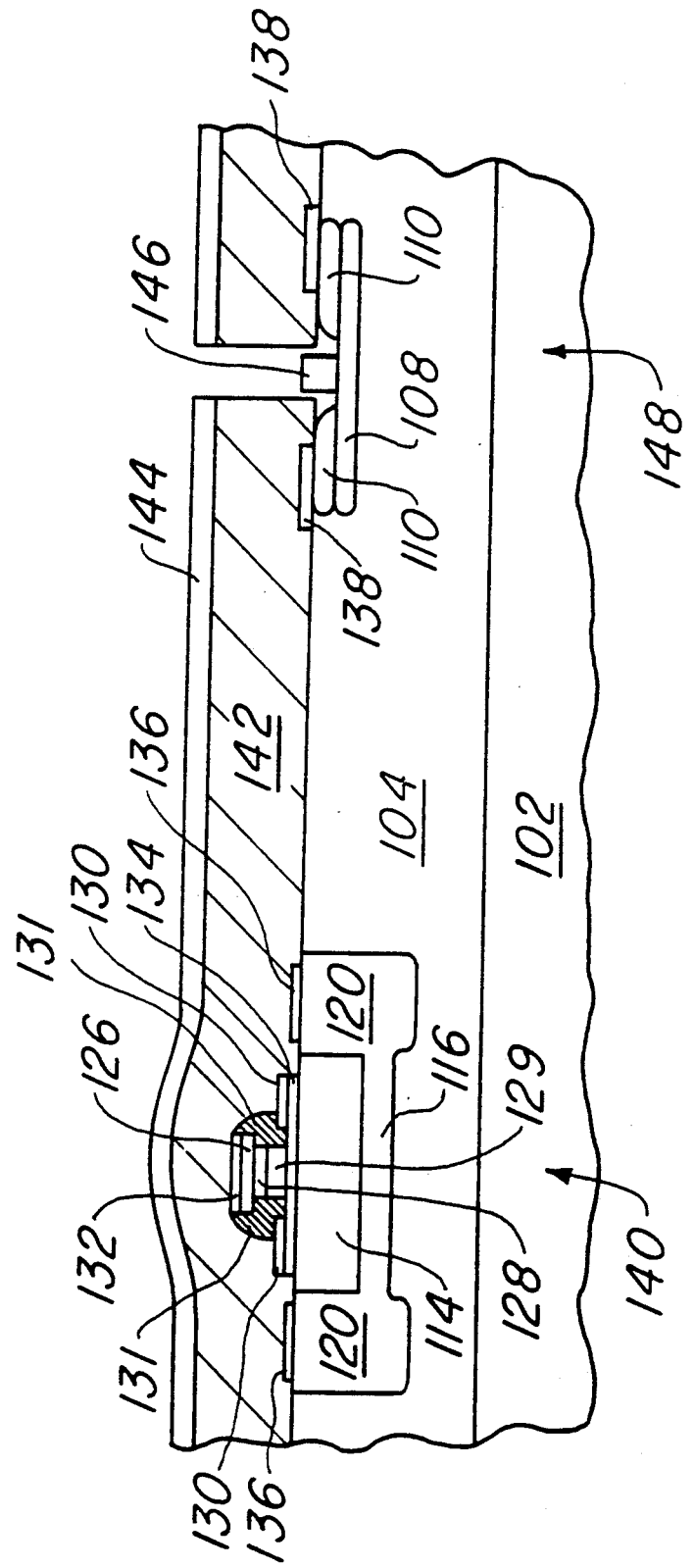
Figure 10:
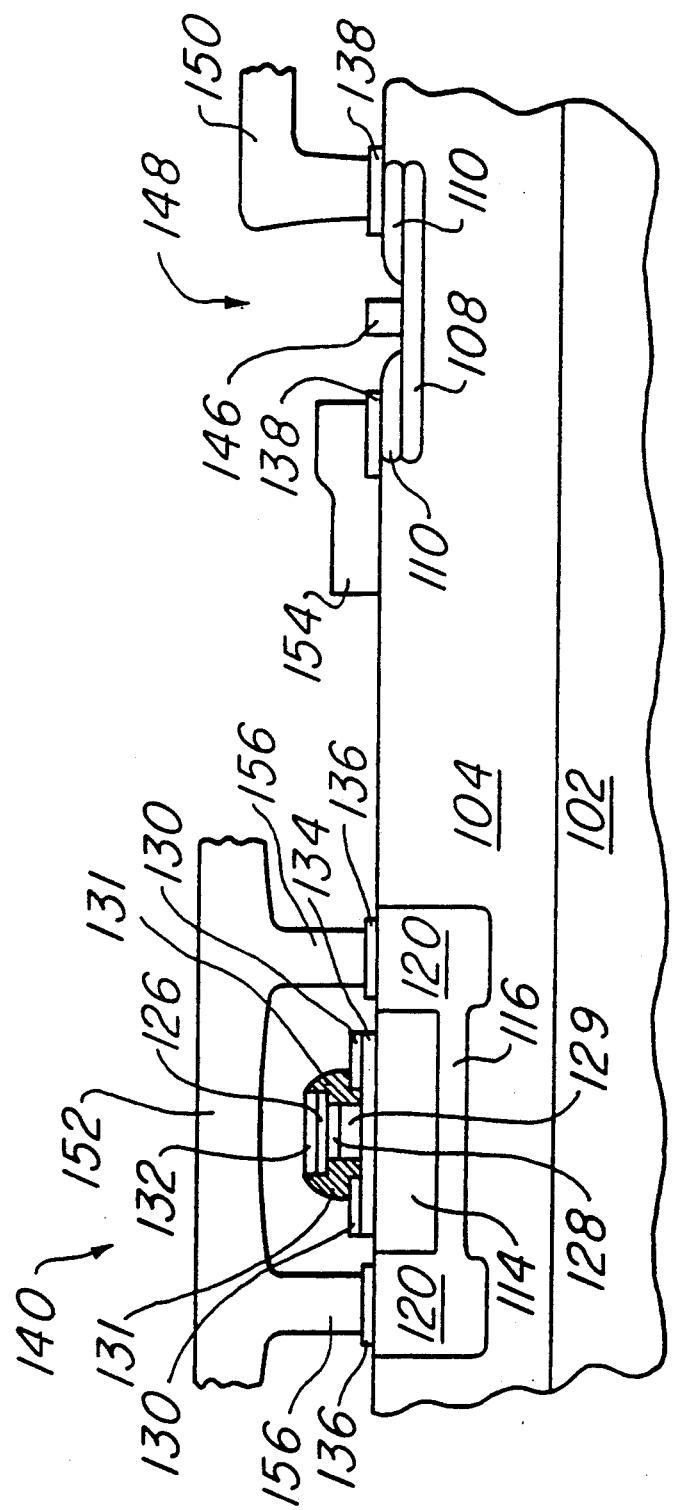

First preferred embodiment method for simultaneously fabricating high power npn heterojunction bipolar transistors (HBTs) and low noise n-channel MESFETs includes the following steps as illustrated in cross sectional elevation views in FIGS. 1-10:

(a) A starting material for this process in shown in FIG. 1; note that the vertical is exaggerated in the drawings for clarity. It is composed of a semi-insulating GaAs substrate 102 oriented in the <100> direction on which 1 micron thick epitaxial layer 104 of semi-insulating GaAs has been grown. The epitaxial layer 104 is optional and could be omitted.

(b) Photoresist 106 is spun on the starting material and patterned to define the location of the n-channel MESFET. Using photoresist 106 as an implant mask, silicon is implanted into epilayer 104 at an energy of 200 keV and dose of $5 \times 10^{12}/cm^2$ to form channel region 108 doped about $2 \times 10^{17}/cm^3$ and situated from about 0.1 $\mu$m to 0.3 $\mu$m beneath the surface. Next, silicon is again implanted but at an energy of 60 keV and dose of $3 \times 10^{13}/cm^2$ to form contact layer 110 doped about $2 \times 10^{18}/cm^3$ and extending from about the surface to channel region 108. See FIG. 2; these implants will be activated in step (e).

(c) Photoresist 106 is stripped and a 1 $\mu$m thick layer of silicon nitride ($Si_3N_4$) 111 is deposited on the surface. A thick (2-3 $\mu$m) layer of photoresist 112 is then spun on and patterned to define the location of the npn HBT. The photoresist 112 pattern is transferred to the nitride 111 by reactive ion etching (RIE) in 92% $CF_4$/8% $O_2$. Using photoresist 112 plus nitride 111 as an implant mask, silicon is implanted into epilayer 104 at energies of 150, 300, and 600 keV with doses of $5 \times 10^{11}/cm^2$, $8 \times 10^{11}/cm^2$, and $1.2 \times 10^{12}/cm^2$, respectively, to form n collector region 114 doped about $3 \times 10^{16}/cm^3$ and extending from the surface to about 0.6 $\mu$m beneath the surface. Next, silicon is again implanted but at an energy of 900-1200 keV and dose of $8 \times 10^{13}/cm^2$ to form n+layer 116 doped about $2 \times 10^{18}/cm^3$ and extending from about the collector region 114 to about 0.5 $\mu$m beneath the surface. See FIG. 3; these implants will also be activated in step (e).

(d) Photoresist 112 is stripped and nitride 111 is removed. A 1 $\mu$m thick layer 117 of nitride is deposited on the surface and photoresist 118 is spun on and patterned to define the location of the collector contacts in the npn HBT. The pattern is transferred to nitride 117 by RIE as in step (c). Using photoresist 118 and nitride 117 as an implant mask, silicon is implanted into epilayer 104 at energies of 200, 500, and 900 keV with doses of $5 \times 10^{13}/cm^2$, and $8 \times 10^{13}/cm^2$, respectively, to form n+collector contacts 120 doped about $2 \times 10^{18}/cm^3$ and extending from the surface to subcollector 116. See FIG. 4; these implants will also be activated in step (e).

(e) Photoresist 118 is stripped, nitride 117 is removed, and the surface is cleaned. Then an epitaxial metalorganic chemical vapor deposition (MOCVD) is performed at temperatures of about 800 C. in an overpressure of arsenic to grow further layers on layer 104; this anneals the previously described implants of silicon resulting in good electrical activation. As an alternative, the substrate can be annealed in a conventional furnace or rapid thermal annealer prior to the epi growth. The epi growth first forms epilayer 122 of p+ GaAs of thickness 0.05-0.1 $\mu$m and in situ doped with zinc (or with beryllium if layer 122 is grown by molecular beam epitaxy (MBE)) to about $1 \times 10^{19}/cm^3$. Then epilayer 124 of n+ $Al_xGa_{1-x}As$ (x=0.25) of thickness 0.1 $\mu$m and in situ doped with silicon to about $2 \times 10^{17}/cm^3$ and epilayer 125 of n+ GaAs of thickness 0.1 $\mu$m and in situ doped with silicon to about $3 \times 10^{18}/cm^3$ are grown. See FIG. 5. Alternatively, the growth may be immediately preceded by a 900 C. anneal for fifteen minutes in the MOCVD reactor, or the growth may be by MBE rather than MOCVD.

The specific layer composition deposited during the epi growth depends upon optimization of the HBT because none of the deposited layers will be used in the MESFET; indeed, the MESFET regions could be masked off during the deposition, but this is superfluous in that the formation of the emitter and base of the HBT will necessarily require removal of portions of the deposited layers.

(f) After the epi growth, photoresist is spun on and patterned to define the location of the emitter of the HBT. Metal (500 Å Au:Ge/140 Å Ni/2,000 Å Au) is evaporated onto the photoresist and the exposed portion of epilayer 125, and the photoresist is removed which lifts off the metal except the portion 126 which is on GaAs epilayer 125. Metal 126 is then used as an etch mask for RIE etching GaAs epilayer 125 and $Al_xGa_{1-x}As$ epilayer 124 with $BCl_3$. This etch is anisotropic but slightly etches the GaAs and $Al_xGa_{1-x}As$ under metal 126 to leave an overhang of about 0.05 $\mu$m of metal on the remaining portions 128 of GaAs layer 125 and 129 of $Al_xGa_{1-x}As$ layer 124; see FIG. 6. GaAs 128 will form the emitter contact layer and $Al_xGa_{1-x}As$ 129 will form the emitter for the HBT. Emitter 129 may be about 2 $\mu$m by 10 $\mu$m with the 2 $\mu$m width shown in the cross sectional view in FIG. 6.

(g) Photoresist is again spun on and patterned to define the location of the base of the HBT; this exposes metal 126 in addition to a portion of p+ GaAs 122. Metal (also Au:Ge/Ni/Au) is evaporated onto the photoresist and metal 126 plus the exposed portion of epilayer 122. The overhanging metal 126 shadows the part of epilayer 122 adjacent emitter 129, so the evaporated metal does not contact emitter 129. The photoresist is removed which lifts off the metal except the portion 130 which is on GaAs epilayer 122 and the portion 132 which is on metal 126. A 0.5 μm thick layer of nitride is conformally deposited and anisotropically etched by RIE to remove all of the nitride except the portion 131 on the sidewalls of the emitter 129 and emitter contact 128. Nitride 131 fills the gap between emitter 129 and metal 130 which will form the base contact. Metal 130 and 132 plus nitride 131 are then used as an etch mask for anisotropically etching p+ GaAs epilayer 122 by RIE with $BCl_3$ to form base 134. The etch is timed to stop once the p+ GaAs layer 122 outside of base 134 is removed; a slight overetch into the n and semi-insulating GaAs does not disrupt the HBT and MESFET being fabricated. See FIG. 7; base 134 may be about 4 μm by 10 μm.

(h) Photoresist is spun on and patterned to define ohmic contacts for both the HBT collector contacts 120 and source/drain of the MESFET. Gold/geranium/nickel is evaporated on and lifted off by removing the photoresist; this forms collector ohmic contacts 136 and source/drain ohmic contacts 138 and completes the HBT, generally denoted by reference numeral 140. The ohmic contacts are alloyed at 435 C. for two minutes. See FIG. 8.

(i) Photoresist 142 is spun on and patterned to define the recessed gate for the MESFET. An isotropic etch of water, hydrogen peroxide, and sulfuric acid ($H_2O$:$H_2O_2$:$H_2SO_4$) is used to etch n+ GaAs region 110 and stop on n− GaAs channel region 108; this etch undercuts the photoresist 142. Titanium/platinum/gold 144 is deposited by evaporation to form gate 146; see FIG. 9 which shows that gate 146 is spaced away from n+ GaAs contact regions 110 by the undercut during the etch. Photoresist 142 is removed and this completes the MESFET, generally denoted by reference numeral 148.

(j) Other items such as impedance matching, air bridges 150 and 152 with supports 156, metal interconnections 154, and vias to backside ground are formed by conventional technologies. See FIG. 10. These other items may couple HBT 140 with MESFET 148 and other HBTs and MESFETs all integrated on the semi-insulating substrate 102-104. Substrate 102 may have a backside metal ground plane with vias from the ground plane to interconnections or other items on the surface with HBT 140 and MESFET 148.

Figure 11:
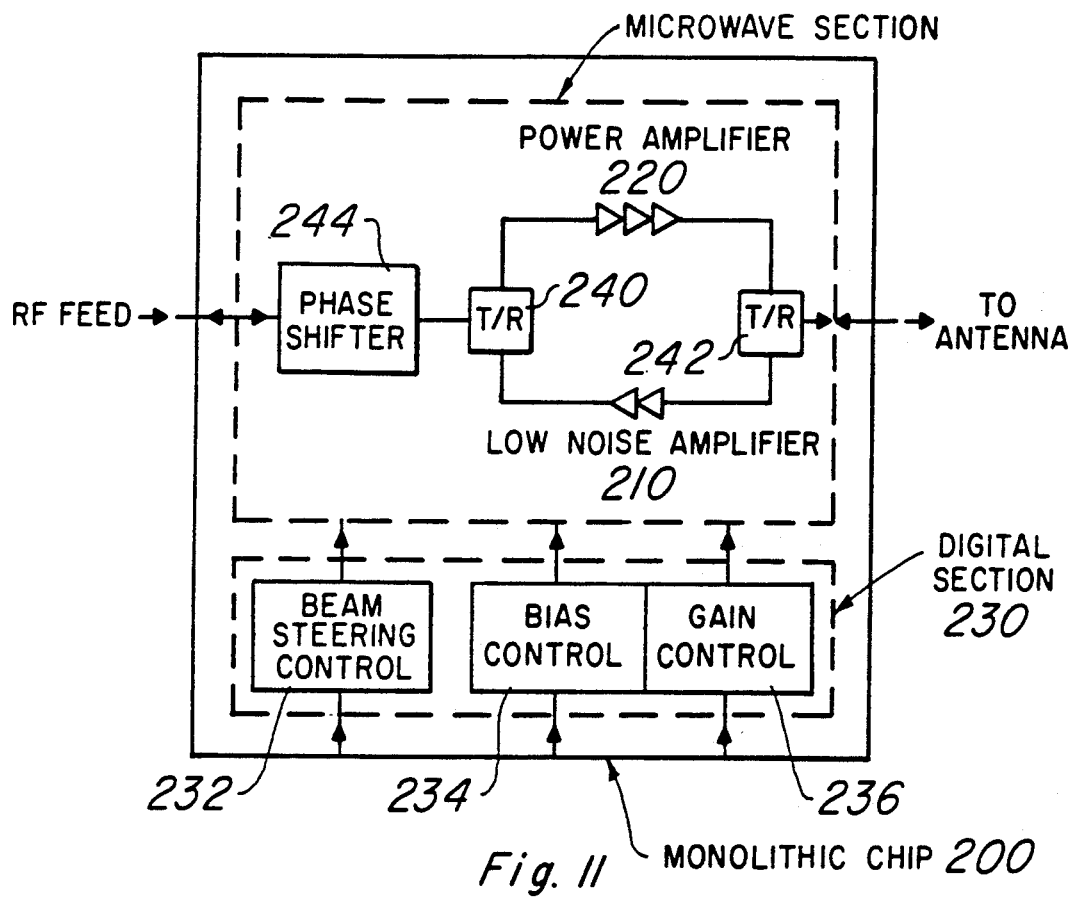
FIG. 11 illustrates schematically an integrated circuit using both low noise amplifier devices and power amplifier devices.

FIG. 11 schematically illustrates an application of the first preferred embodiment: an integrated circuit (monolithic chip 200) that contains both low noise MESFETs in low noise amplifier 210 and HBTs in power amplifier 220. Monolithic chip 200 provides a module that could be used in a phased array radar system. The digital control portion 230 of chip 200 (beam steering control section 232, bias control section 234, and gain control section 236) may be made of HBTs, transmit/receive switches 240 and 242 may be made of MESFETs, and phase shifter 244 may be made of MESFETs. The performance limiting portions of chip 200 are low noise amplifier 210 and power amplifier 220; so by integrating MESFETs with HBTs, the overall performance is optimized.

MODIFICATIONS AND ADVANTAGES

Various modifications of the preferred embodiment devices and methods may be made while retaining the features of quasiplanar and electrically isolated transistors.

Figure 12:
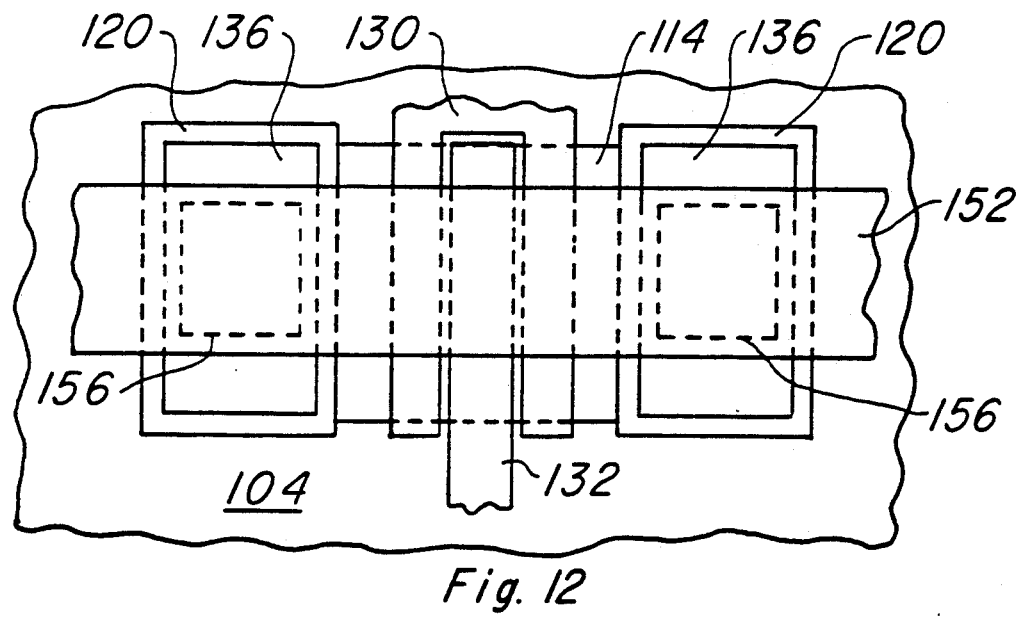
FIG. 12 is a plan view of a first preferred embodiment HBT.

For example, for high power HBT structures the implantation of the collector may use high energies that will require an implant mask other than the photoresist plus nitride used in the preferred embodiments; the MESFET gate can be fabricated by optolithography (for $\geq 1$ μm gate length) or electron beam lithography (for $\leq 1$ μm gate length); the HBT implantations may be performed prior to the MESFET implantations or even in interleaved order and p-n-p HBTs and p channel MESFETs may be included by varying the implantation or in situ dopants or growing undoped epilayers and selectively doping them by diffusion or implantation; other semiconductor materials such as other III-V alloys or II-VI alloys may be used and the semi-insulating substrate may be GaAs-on-silicon or other compound structures; the bandgap of the base material may be graded to provide built-in acceleration of the minority carriers to the collector such as making the base of $Al_xGa_{1-x}As$ with x varying from 0.05 at the emitter to 0.0 at the collector; a wide-gate-recess etch for the MESFET may be used in which the n+ layer (plus a portion of the n layer) is etched away with a first phototresist mask and then the gate applied with a second photoresist mask; the MESFET may be fabricated without the heavily doped contact layer and without gate recess; and the element shapes, dimensions, topologies, and topographies may be varied. Indeed, with an elongated emitter and base (see plan view in FIG. 12), the evaporation of metal 130 may be angled using the emitter structure 129, 128, 126 as part of the mask to offset metal 130 from the emitter structure; the evaporation would require two evaporations steps: one for each side of the emitter structure. This extra offsetting of metal 130 from the emitter structure lessens the leakage and shorts from emitter to base as the thicknesses of emitter 129 and emitter contact 128 are decreased. FIG. 12 has the same reference numerals as FIG. 10 for the corresponding elements of HBT 140. The interface between the base layer (122, 134) and the collector region (114) and/or the base layer and the emitter region may be characterized by epitaxial growth of in situ doped semiconductor material on the layer of semi-insulating semiconductor material 104. The emitter region may include an emitter contact sublayer (125, 128) and an emitter sublayer (124, 129), the emitter sublayer abutting the base (122, 134) and the emitter contact sublayer abutting the emitter sublayer, wherein the emitter sublayer is made of semiconductor material with a wider bandgap than the base layer semiconductor material and the emitter sublayer is made of semiconductor material with a narrower bandgap than the collector sublayer semiconductor material. A contact to the emitter sublayer can be formed of a metal and the edges of the emitter sublayer can be aligned to the metal contact edges.

Advantages of the first preferred embodiment method include its simplicity and quasi-planar surface (the base 134 is only 0.05 μm thick and emitter contact 128 plus emitter 129 are only 0.2 μm thick and metal 126 and 132 are 0.2 μm thick, so the total height of the HBT structure above the (collector) surface is only 0.45 μm. Also, the transistors are implanted directly into the semi-insulating substrate and are isolated so no lattice damage or trench isolation is required, and the HBTs and MESFETs are separately implanted, so they may be individually optimized.

What is claimed is:

1. An integrated circuit including both bipolar and field effect devices, comprising:
   (a) a first continuous layer of semi-insulating semiconductor material having a continuous first surface;
   (b) a doped channel region in said first layer at said first surface of said first layer;
   (c) a doped collector region in said first layer at said first surface spaced from said channel region;
   (d) a doped base layer on said collector region, said base layer of conductivity type opposite that of said collector region;
   (e) a doped emitter region on said base layer, said emitter region of the same conductivity type as said collector to provide a bipolar device, said emitter region made of semiconductor material with a wider bandgap than said base layer semiconductor material;
   (f) source and drain contacts on said channel region;
   (g) a gate on said channel region between said source and drain contacts to provide a said field effect device; and
   (h) electrical coupling between at least one of said emitter, base and collector of said bipolar device and at least one of said gate, source and drain of said field effect device.

2. The integrated circuit of claim 1, wherein:
   (a) said emitter region plus said base layer have a total thickness of less than 0.5 μm.

3. The integrated circuit of claim 1, wherein:
   (a) said first layer is GaAs;
   (b) said base layer is GaAs; and
   (c) said emitter region is $Al_xGa_{1-x}As$.

4. The integrated circuit of claim 3, wherein:
   (a) said channel region is n type;
   (b) said collector region is doped n type;
   (c) said base layer p type; and
   (d) said emitter region is n type.

5. The integrated circuit of claim 1, wherein:
   (a) said source and drain contacts include first doped contact regions of said first layer located between portions of said channel and said first surface, said first doped contact regions of the same conductivity type as and more heavily doped than said channel region; and
   (b) said collector region includes collector contact regions which are more heavily doped than the portion of said collector region abutting said base layer.

6. The integrated circuit of claim 1, wherein:
   (a) said first surface is nonplanar at said gate and said gate is recessed.

7. The integrated circuit of claim 1, wherein:
   (a) the interface between said base layer and said collector region is characterized by epitaxial growth of in situ doped semiconductor material on said first layer.

8. The integrated circuit of claim 1, wherein:
   (a) the interface between said emitter layer and said base layer is characterized by epitaxial growth of in situ doped semiconductor material on said base layer.

9. The integrated circuit of claim 1, wherein:
   (a) said emitter region includes an emitter contact sublayer and an emitter sublayer, said emitter sublayer abuts said base and said emitter contact sublayer abuts said emitter sublayer, said emitter sublayer made of semiconductor material with a wider bandgap than said base layer semiconductor material, and said emitter contact sublayer made of semiconductor material with a narrower bandgap than said emitter sublayer semiconductor material.

10. The integrated circuit of claim 1, wherein:
    (a) said emitter region includes an emitter sublayer and a metal sublayer, said emitter sublayer made of semiconductor material, and said emitter sublayer with edges aligned to said metal sublayer edges.

11. A heterojunction bipolar transistor device, comprising:
    (a) a first layer of semi-insulating semiconductor material having a first surface;
    (b) a doped collector region in said first layer at said first surface;
    (c) a doped base layer on said collector region, said base layer of conductivity type opposite that of said collector region, wherein the interface between said base layer and said collector region is characterized by epitaxial growth of in situ doped semiconductor material on said first layer;
    (d) a doped emitter layer on said base layer, said emitter layer of the same conductivity type as said collector to provide a said bipolar device;
    (e) said emitter layer made of semiconductor material with a wider bandgap than said base layer semiconductor material.

12. The heterojunction bipolar transistor device of claim 11, wherein:
    (a) said emitter layer plus said base layer have a total thickness of less than 0.5 microns.

13. The heterojunction bipolar transistor device of claim 11, wherein:
    (a) said first layer is GaAs;
    (b) said base layer is GaAs; and
    (c) said emitter layer is $Al_xGa_{1-x}As$.

14. The heterojunction bipolar transistor device of claim 13, wherein:
    (a) said collector region is doped n-type;
    (b) said base layer p-type; and
    (c) said emitter layer is n-type.

15. The heterojunction bipolar transistor device of claim 11, wherein:
    (a) said collector region includes collector contact regions which are more heavily doped than the portion of said collector region abutting said base layer.

16. The heterojunction bipolar transistor device of claim 11, wherein:
    (a) the interface between said emitter layer and said base layer is characterized by epitaxial growth of in situ doped semiconductor material on said base layer.

17. The heterojunction bipolar transistor device of claim 11, wherein:
    (a) said emitter layer includes an emitter contact sublayer and an emitter sublayer, said emitter sublayer abuts said base and said emitter contact sublayer abuts said emitter sublayer, said emitter sublayer made of semiconductor material with a wider bandgap than said base layer semiconductor material, and said emitter contact sublayer made of semiconductor material with a narrower bandgap than said emitter sublayer semiconductor material.

18. The heterojunction bipolar transistor device of claim 11, wherein:
    (a) said emitter layer includes an emitter sublayer and a metal sublayer, said emitter sublayer made of semiconductor material, and said emitter sublayer with edges aligned to said metal sublayer edges.

* * * * *